(12) United States Patent
Baba

(10) Patent No.: US 6,597,582 B2
(45) Date of Patent: Jul. 22, 2003

(54) SEMICONDUCTOR DEVICE INCORPORATING MODULE STRUCTURE

(75) Inventor: Shinji Baba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/170,582

(22) Filed: Jun. 14, 2002

(65) Prior Publication Data

US 2002/0149920 A1 Oct. 17, 2002

Related U.S. Application Data

(62) Division of application No. 09/598,413, filed on Jun. 21, 2000, now Pat. No. 6,426,877.

(30) Foreign Application Priority Data

Dec. 27, 1999 (JP) ............................................. 11-371452

(51) Int. Cl.[7] ................................................. H05K 7/10
(52) U.S. Cl. ........................ 361/760; 361/741; 361/756; 361/807; 439/377; 439/946; 174/138
(58) Field of Search ................................. 361/760, 807, 361/756, 741, 796, 801, 752, 764, 767, 772, 783, 790, 784, 761, 785, 802, 803, 820, 702, 696, 697, 709, 735, 810; 174/138; 439/377, 96, 945, 946; 257/678, 679

(56) References Cited

U.S. PATENT DOCUMENTS

| | | | |
|---|---|---|---|
| 5,128,831 A | * | 7/1992 | Fox, III et al. ............. 361/735 |
| 5,400,003 A | | 3/1995 | Kledzik |
| 5,434,745 A | * | 7/1995 | Shokrgozar et al. ........ 361/735 |
| 5,727,955 A | | 3/1998 | Tsubakihara |
| 5,734,555 A | | 3/1998 | McMahon |
| 5,790,384 A | | 8/1998 | Ahmad et al. |
| 6,089,920 A | * | 7/2000 | Farnworth et al. .......... 439/632 |
| 6,181,567 B1 | | 1/2001 | Roemer et al. |
| 6,278,609 B1 | * | 8/2001 | Suzuki et al. ............... 361/704 |
| 6,285,556 B1 | * | 9/2001 | Guth et al. .................. 361/752 |

FOREIGN PATENT DOCUMENTS

JP          8-288026          11/1996

* cited by examiner

*Primary Examiner*—David Martin
*Assistant Examiner*—Hung Bui
(74) *Attorney, Agent, or Firm*—McDermott, Will & Emery

(57) ABSTRACT

A semiconductor device comprises a plurality of semiconductor block modules mounted on a system board. The semiconductor block module comprises a block socket and a module board fitted thereto. The block socket assumes an annular shape and has connection terminals on upper and lower peripheral surfaces thereof and has an inner groove formed on the inner surface thereof. The module board has at least a semiconductor chip mounted thereon and is fitted into the inner groove of the block socket. The module board is electrically connected to the block socket. The connection terminals on the upper peripheral surface of the module socket may be mechanically fitted into and electrically connected to the connection terminals on the lower peripheral surface of other block socket having the same structure.

6 Claims, 10 Drawing Sheets

SEMICONDUCTOR DEVICE INCORPORATING MODULE STRUCTURE

This application is a Divisional of application Ser. No. 09/598,413 filed Jun. 21, 2000 now U.S. Pat. No. 6,426,877.

BACKGROUND OF THE INVENTION

1. Field of the Invention

The present invention relates to a high-density packaging technique for packaging a multi-function semiconductor device formed by mounting a module board on a block socket. More particularly, the present invention relates to a semiconductor device and a method of packaging a semiconductor device, which materialize greater packaging reliability, greater ease of packaging, facilitated reworking of a semiconductor device, a higher-performance system board, a more efficient dissipation characteristic, cost reduction stemming from a compact system being embodied through use of a three-dimensional package, a shorter length of electrical connection between semiconductor devices, and faster processing speed as compared with the case of a conventional semiconductor and packaging method.

2. Background Art

FIG. 14 is a perspective view showing a conventional semiconductor device which corresponds to background art of a first type, and FIG. 15 is a structural cross-sectional view showing another conventional semiconductor device which corresponds to background art of a second type. In FIG. 14, reference numeral 2 designates a module board; 3 designates a semiconductor chip; and 20 designates a solder ball. In FIG. 15, reference numeral 2 designates a module board; 3 designates a semiconductor chip; 4 designates a bump; 5 designates an under-fill resin; 6 designates a system board; and 20 designates a solder ball.

A semiconductor device of ball grid array (BGA) type, a semiconductor device of pin grid array (PGA) type, or a semiconductor device of land grid array (LGA) type (each falling under background art of the first type as shown in FIG. 14) is described as a conventional semiconductor device which has a plurality of input/output terminals and is used for an application requiring high electrical and thermal performance. In a semiconductor device of these types, a single or a plurality of semiconductor chips 3 are mounted on the module board 2 serving as a high-density wiring board, and the solder balls 20 are provided on the underside of the module board 2 for establishing an electrical contact between electrodes of the semiconductor chips 3 and the outside of a semiconductor device module.

There is also described a semiconductor device of multi-chip module type (MCM) (which falls under background art of the second type as shown in FIG. 15). Specifically, a single or a plurality of semiconductor chips 3 are mounted on the module board 2 serving as a high-density wiring board while being secured by the underfill resin 5. The solder balls 20 are provided on the underside of the module board 2 for establishing an electrical contact between the bumps 4 formed on the underside of each of the semiconductor chips 3 and the outside of a semiconductor chip module, thereby constituting a multi-chip module. This multi-chip module is mounted on the system board 6 by way of the solder balls 20, interconnection pins, or like elements.

However, the above-described background art involves the following problems. In a semiconductor device of MCM type having a large number of input/output terminals as a multi-pin-type semiconductor device, signals are exchanged within the module, thereby diminishing the number of input/output terminals to be used for connection with the system board 6. However, the semiconductor device of the background art encounters a first problem; specifically, in association with an improvement in the performance of the system board 6, the MCM is required to have a larger number of terminals. If the outer dimension of the MCM are increased, there may arise a reduction in packaging reliability and electrical performance of the semiconductor device, an increase in cost of the semiconductor device, and bloating of the system board 6.

A second problem encountered by the semiconductor device of MCM type is that an increase in the outer dimension of the MCM induces a warpage of a board or an error in positional accuracy of terminals, thus rendering difficult packaging of the MCM on the system board 6 (i.e., a problem in relation to packaging characteristic).

A third problem of the semiconductor device of the background art is that an increase in the outer dimensions of the semiconductor device results in deterioration of the packaging reliability of the semiconductor device, due to a difference in coefficient of thermal expansion between the semiconductor chip 3 and the system board 6 (i.e., a problem in relation to packaging reliability). Particularly, the outer dimension of a semiconductor device of BGA type are limited to substantially a value of 40 to 50 mm or thereabouts. In an application which requires a semiconductor device having large outer dimensions; that is, a large number of terminals, a semiconductor device of PGA or LGA type is employed, and a socket must be interposed between the semiconductor device and a mounting board, thereby imposing a problem in relation to cost.

A fourth problem is that difficulty in replacing a semiconductor device or an MCM mounted on the system board 6 with another device for eliminating a failure or improving the performance of the system board 6 (i.e., a problem in relation to reworking). Particularly, a problem in relation to reworking becomes readily apparent particularly in the case of a semiconductor device of BGA type.

A fifth problem is that a semiconductor device is in principle mounted on the system board 6 two-dimensionally. As the performance of the semiconductor device improves, the system board 6 grows in size. Therefore, rendering the system board 6 compact is difficult (i.e., a problem in relation to miniaturization).

A sixth problem is that as the performance of the semiconductor device improves, the cost of the semiconductor device is remarkably increased for reasons of a resultant increase in the size of the system board 6, a resultant decrease in the yield of the semiconductor device due to difficulty in packaging, a resultant requirement to use a socket for ensuring the packaging reliability of the semiconductor device, and a difficulty in reworking (i.e., a problem in relation to cost).

A seventh problem is that a connection of a radiating fin has been achieved by means of various contrivances. However, all of the contrivances are difficult, and demand exists for an improvement of the radiating film in terms of performance and cost (i.e., a problem in relation to heat dissipation).

An eighth problem is that the length of connection between semiconductor devices having many input/output terminals; particularly, a distance between semiconductor devices of MCM type, becomes longer, thereby hindering the semiconductor device from exhibiting sufficient high-speed performance (i.e., a problem in relation to high-speed characteristic).

SUMMARY OF THE INVENTION

The present invention has been conceived to solve these problems in relation to the background art and is aimed at providing a semiconductor device and a method of packaging a semiconductor device which, as compared with the case of a conventional semiconductor device and packaging method, materialize greater packaging reliability, greater ease of packaging, facilitation of reworking of the semiconductor device, a higher-performance system board, and a more efficient dissipation characteristic.

According to one aspect of the present invention, a semiconductor block module comprises a block socket and a module board fitted therein. The block socket is of an annular shape, and has connection terminals on upper and lower peripheral surfaces thereof, and has an inner groove formed on the inner surface thereof. The module board has a semiconductor chip mounted thereon, and fitted into the inner groove of the block socket. The module board is electrically connected to the block socket, and the connection terminals on the upper peripheral surface of the block socket may be mechanically fitted into and electrically connected to the connection terminals on the lower peripheral surface of other block socket having the same structure.

According to another aspect of the present invention, a semiconductor device comprises a system board and a semiconductor block module as described above which is mounted on the system board. The semiconductor block module is electrically connected to the system board.

Other and further objects, features and advantages of the invention will appear more fully from the following description.

DETAILED DESCRIPTION OF THE PREFERRED EMBODIMENTS

First Embodiment

Figure 1A:
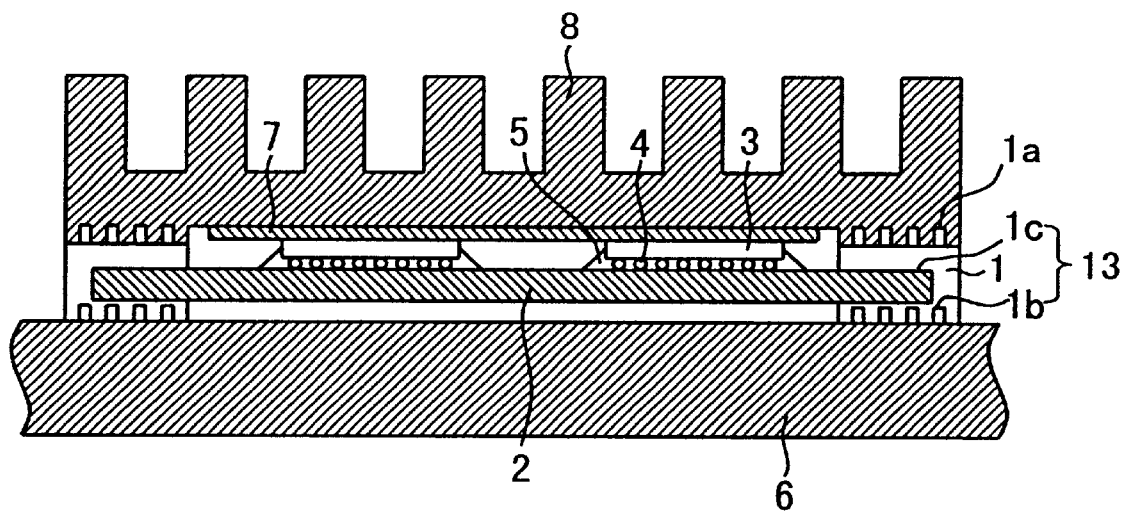
FIG. 1A is a structural cross-sectional view showing a semiconductor device according to a first embodiment of the present invention.

A first embodiment of the present invention will now be described in detail by reference to the accompanying drawings. FIG. 1A is a structural cross-sectional view showing a semiconductor device according to a first embodiment of the present invention. In FIG. 1A, reference numeral 1 designates a rectangular and annular block socket; 1a designates a protruding upper connection terminal of the block socket 1; 1b designates an indented lower connection terminal of the block socket 1; 1c designates a fitting groove formed on the inner surface of the block socket 1; 2 designates a module board; 3 designates a semiconductor chip mounted on a module board 3; 4 designates a bump for connecting the semiconductor chip 3 to the module board 2; 5 designates an under-fill resin for protecting the bump 4; 6 designates a system board; 7 designates a heat dissipation sheet; and 8 designates a heat radiating plate having radiating fins.

As shown in FIG. 1A, a semiconductor device of the present embodiment has the block socket 1, and the protruding upper connection terminals 1a and the indented lower connection terminals 1b are provided on the outer surface of the block socket 1. The module board 2 is fitted into an internal space by fitting into the groove 1c formed on an internal surface of the annular block socket 1. One or a plurality of semiconductor chips 3 (two semiconductor chips 3 are shown in FIG. 1) are mounted on the module board 2 by way of the bumps 4. The under-fill resin 5 is interposed between the module board 2 and the semiconductor chips 3 for ensuring the reliability of a joint formed by the bumps 4. Components to be mounted on the module board 2 are not limited to the semiconductor chips 3; any electronic components having the form of a chip, such as chip capacitors, may also be mounted on the module board 2. In a case where chip capacitors are mounted on the module board 2, improved electrical stability of the semiconductor device can be embodied.

In the present embodiment, the semiconductor chip 3 is connected to the module board 2 by way of the bumps 4, i.e., by way of a bump connection method. However, the present invention is not limited particularly to this method; the semiconductor chip 3 may be mounted on the module board 2 by means of the wire bonding technique.

The heat radiating plate 8 is connected to the top of the semiconductor chip 3 by way of the heat dissipation sheet 7, and is secured to the top of the block socket 1. Further, the underside of the block socket 1 is connected to, or mounted on, the system board 6.

Figure 1B:
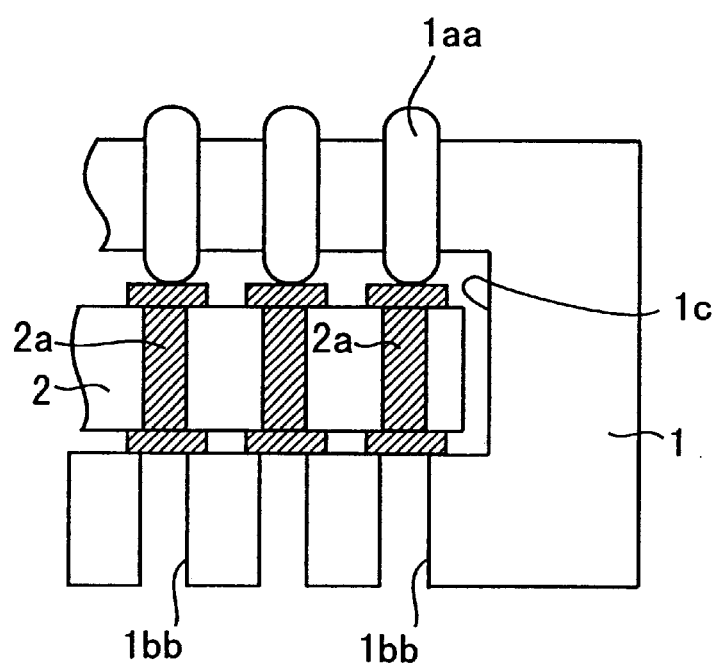
FIG. 1B shows a partial cross-sectional view of an example of a connection between a block socket and a module board.

FIG. 1B shows a partial cross-sectional view of an example of a connection between a block socket 1 and a module board 2. In this example, a plurality of pins 1aa is disposed at the upper portion of the block socket 1, and a plurality of holes 1bb are opened in the lower portion of the block socket 1. A plurality of connecting terminals 2a are disposed at a peripheral portion of the module board 2. When the module board 2 is inserted into the block socket 1, the upper end of each connecting terminal 2a contacts each pin 1aa of the block socket 1, and the lower end of each connecting pins 2a is positioned at each hole 1bb of the block socket 1.

Although not shown in the drawings, when the block socket 1 is mounted on a system board 6, a plurality of pins (not shown) on the system board 6 is mechanically fixed into the holes 1bb of the block socket 1 and electrically connected to the lower end of the connecting terminals 2a of the module board 2.

Further, a plurality of hole are formed in the lower peripheral portion of the heat radiating plate 8. The pins 1aa of the block socket 1 may be secured into the holes of the heat radiating plate 8, by which the heat radiating plate 8 and the block socket 1 is mechanically fixed.

The present embodiment as described above may be re-stated as follows. The semiconductor block module 13 comprises a block socket 1 and a module board 2 inserted into the block socket 1. The block socket assumes an annular shape, and has a plurality of connection terminals 1a, 1b on upper and lower peripheral surfaces thereof, and has an inner groove 1c formed on the inner surface thereof. The module board 2 has a semiconductor chip 3 mounted thereon, and fitted into the inner groove 1c of the block socket 1. The module board is electrically connected to the block socket. The connection terminals 1a on the upper peripheral surface is so formed to be mechanically fitted into and electrically connected to the connection terminals 1b on the lower peripheral surface of other block socket 1 having the same structure.

Further, a heat radiating plate 8 is provided on the semiconductor block module 13. The heat radiating plate is mechanically connected to the connection terminals 1a on the upper peripheral surface of the block socket 1. Further, a heat radiation sheet 7 is interposed between the semiconductor chip 3 and the heat radiation plate 8.

The semiconductor device of the present embodiment yields the following advantages. A first advantage is that since the module board 2 is mounted on the system board 6 by way of the block socket 1, there is prevented a connection failure, which would otherwise be caused by thermal expansion, thereby achieving greater packaging reliability than that achieved by the conventional semiconductor device. A second advantage is that the module board 2 can be readily mounted on the system board 6 by means of simply inserting the module board 2 into the block socket 1, thus achieving greater ease in packaging than that achieved by the conventional semiconductor device. A third advantage is that such a high degree of ease of packaging enables facilitation of reworking of the semiconductor device. A fourth advantage is that even when a semiconductor device is provided with, for example 1000 pins or more, as a result of improvement in the performance of the system board 6 and an accompanying increase in the outer dimensions of the system board 6, the semiconductor device can sufficiently cope with such an increase in the number of pins. A fifth advantage is that the radiating plate 8 can be readily mounted on the semiconductor device by way of the block socket 1. Accordingly, the radiating plate 8 can be connected directly to the semiconductor chips 3, thereby ensuring a sufficiently large heat dissipation area. Thus, the semiconductor device can exhibit a highly efficient heat dissipation.

Second Embodiment

Figure 2:
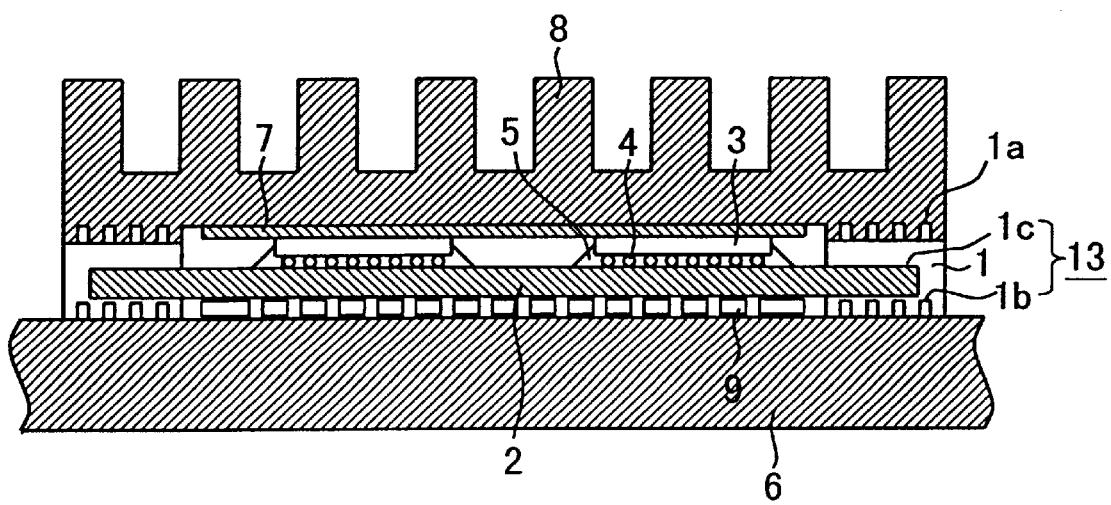
FIG. 2 is a structural cross-sectional view showing a semiconductor device of a second embodiment of the present invention.

A second embodiment of the present invention will now be described in detail by reference to corresponding drawings. Those elements which are the same as those described in connection with the previous embodiment are assigned the same reference numerals, and repetition of their explanations is omitted for brevity. FIG. 2 is a structural cross-sectional view showing a semiconductor device of the second embodiment having an anisotropic conductive sheet 9 or a like element.

As shown in FIG. 2, a semiconductor device of the present embodiment has a particularly high number of terminals, and the anisotropic conductive sheet 9 is interposed between the system board 6 and the module board 2. As a result, connection terminals provided on the entire surface of the module board 2 can be connected to the system board 6 as well as via the connection terminals 1a and 1b of the block socket 1. Namely, the anisotropic conductive sheet 9 can establish connecting circuits between the electric terminals of the module board 2 and the electric terminals of the system board 6.

Accordingly, the number of connection terminals can be increased remarkably. Further, the length of a connection path between the system board 6 and the semiconductor chips 3 by way of the module board 2 can be minimized, thus achieving high electrical performance, i.e., high-speed characteristic. Even in terms of heat dissipation characteristic, heat can be dissipated to the system board 6 by way of the anisotropic conductive sheet 9 as well as to the radiating plate 8 connected to the top of the block socket 1, thus achieving a strong heat dissipation characteristic.

The present embodiment can also be embodied by means of connection through use of generally-called POGO pins in lieu of the anisotropic conductive sheet 9.

The present embodiment as described above may be re-stated as follows. In the semiconductor device, an anisotropic conductive sheet 9 is interposed between the module board 2 and the system board 6 for connecting the terminals of the module board 2 with the terminals of the system board 6.

Third Embodiment

Figure 3:
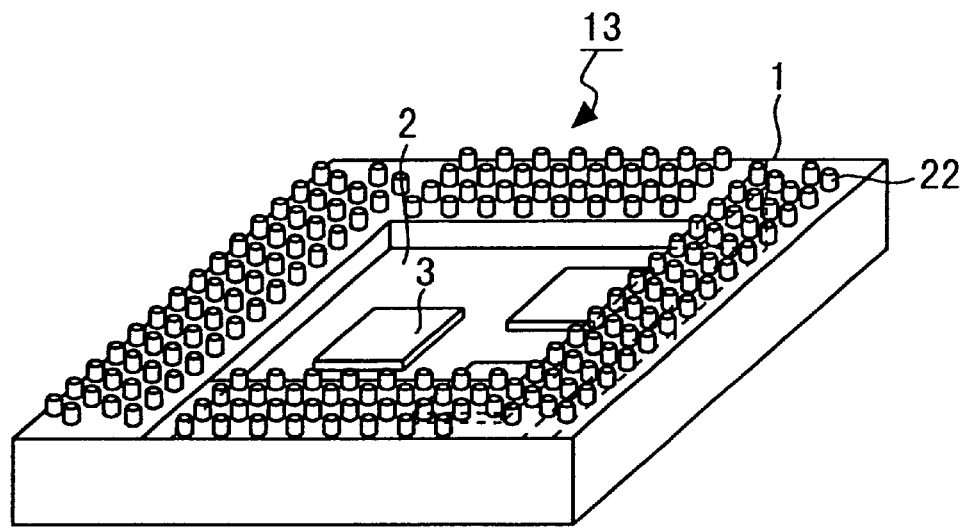
FIG. 3 is a perspective view for describing the form of a block socket employed in the semiconductor device in a third embodiment.

A third embodiment of the present invention will now described in detail by reference to corresponding drawings. Those elements which are the same as those described in connection with the previous embodiments are assigned the same reference numerals, and repetition of their explanations is omitted for brevity. FIG. 3 is a perspective view for describing the form of the block socket 1 employed in the semiconductor device of the third embodiment. In FIG. 3, reference numeral 22 designates a socket terminal, i.e., a protruding upper connection terminal.

As shown in FIG. 3, the present embodiment is directed to a semiconductor device comprising the block socket 1, and the module board 2 is fitted into the block socket 1. The status of the module board 2 mounted on the block socket 1, as illustrated in FIG. 3, can be tested through use of socket terminals 22 provided on the block socket 1. In the event that the module board 2 is found to be defective, the module board 2 can be readily removed from the block socket 1, thus achieving easy reworking.

Fourth Embodiment

Figure 4:
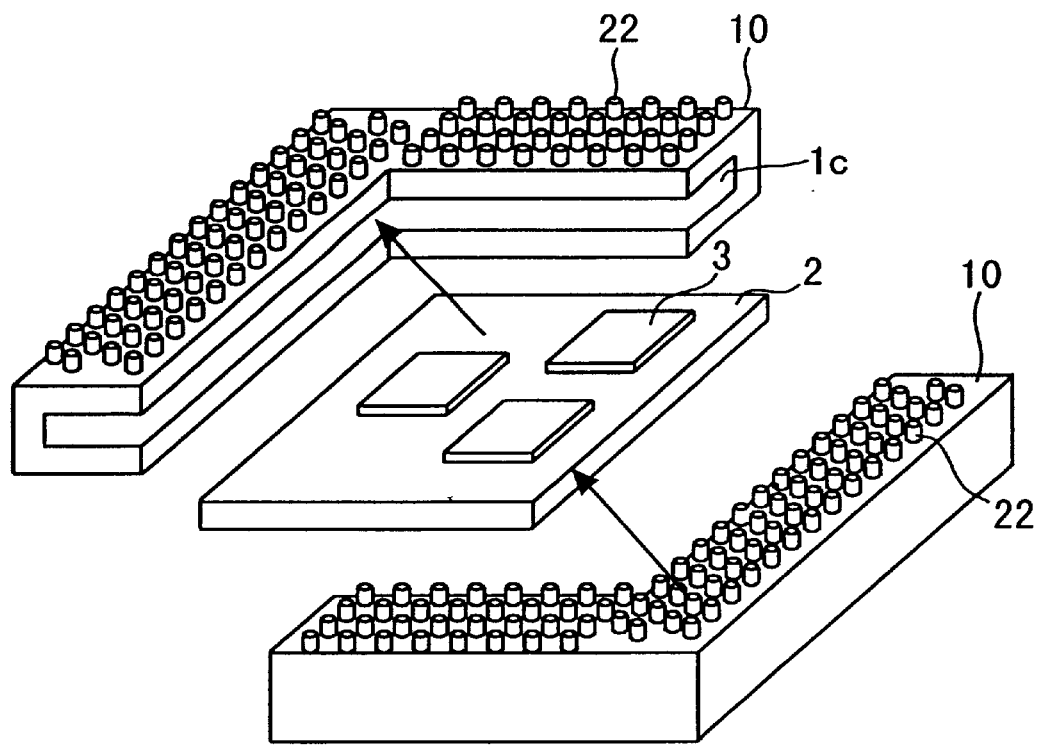
FIG. 4 is an illustration for describing a method of attaching a module board to a block socket in a semiconductor device in a fourth embodiment.

A fourth embodiment of the present invention will now be described in detail by reference to corresponding drawings. Those elements which are the same as those described in connection with the previous embodiments are assigned the same reference numerals, and repetition of their explanations is omitted for brevity. FIG. 4 is an illustration for describing a method of attaching the module board 2 to the block socket 1 in a semiconductor device of the present embodiment.

According to the mounting method using the L-shaped block socket pieces 10 of the present embodiment, the module board 2 is sandwiched between the two L-shaped block socket pieces 10 of the same shape, whereby the module board 2 is fitted into the groove 1c of the block socket 1. Thus, facilitated attachment of the module board 2 to the block socket 1 can be embodied. Standardization of the L-shaped block socket pieces 10 enables a reduction in manufacturing cost. The L-shaped block socket pieces 10 may not be of the identical shape, but may be of different types as long as the two pieces form a block socket in combination.

The present embodiment as described above may be re-stated as follows. In the semiconductor block module 13, the block socket 1 is formed to be disassembled, and the module board 2 is to be detached. The block socket 1 may be assembled by two L-shaped block socket pieces 10.

Fifth Embodiment

Figure 5:
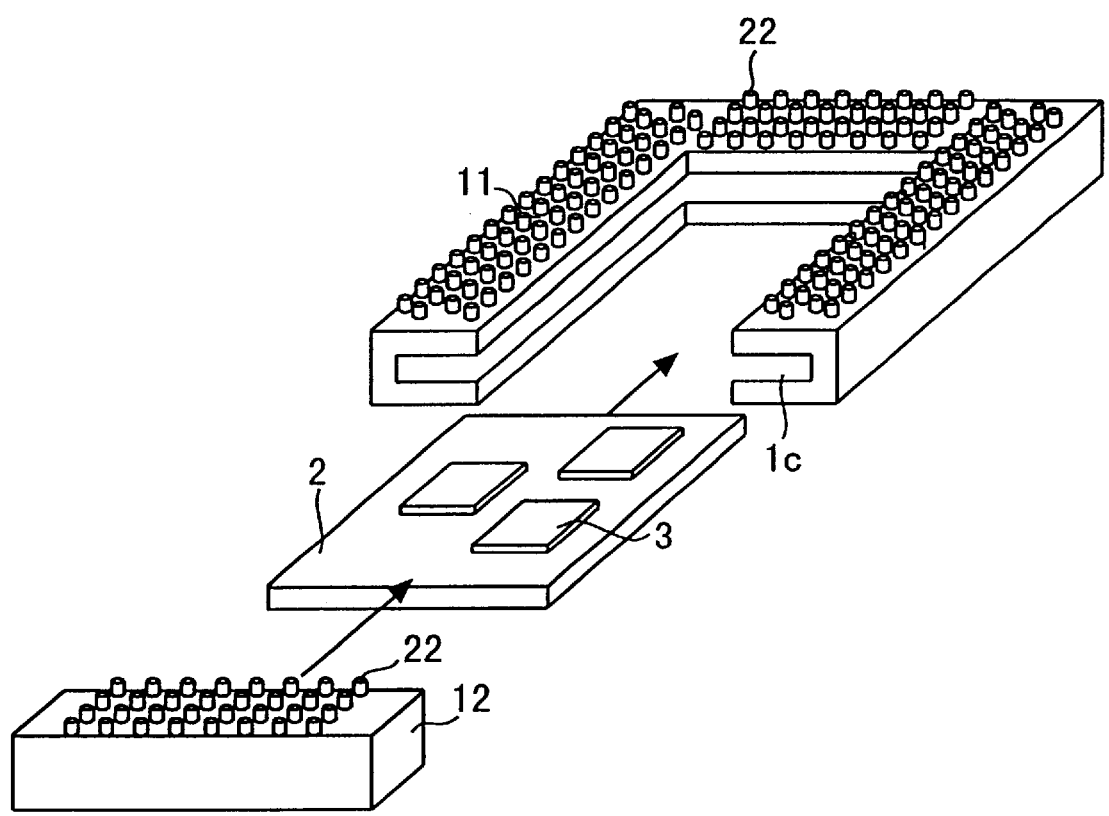
FIG. 5 is an illustration for describing a method of attaching a module board to a block socket in a semiconductor device in a fifth embodiment.

A fifth embodiment of the present invention will now be described in detail by reference to corresponding drawings. Those elements which are the same as those described in connection with the previous embodiments are assigned the same reference numerals, and repetition of their explanations is omitted for brevity. FIG. 5 is an illustration for describing a method of attaching the module board 2 to the block socket 1 through use of a U-shaped block socket piece 11 and a bar-shaped block socket piece 12 in a semiconductor device of the present embodiment.

According to the method of attaching the module board 2 to the block socket 10 through use of the U-shaped block socket piece 11 and the bar-shaped block socket piece 12, the module board 2 is fitted into the groove 1c of the U-shaped block socket 11 shown in FIG. 5. Then, the module board 2 is press-fitted into the block socket 1 through use of the bar-shaped block socket piece 12. Thus, the method of the present embodiment enables a good packaging characteristic. The U-shaped block socket piece 11 may be of the shape to form a three sides of a block socket 10, and the bar-shaped block socket piece 12 may be of the shape to form one side of a block socket 10.

The present embodiment as described above may be re-stated as follows. In the semiconductor block module 13, the block socket may be assembled by a U-shaped block socket piece 11 and a bar-shaped block socket piece 12.

Sixth Embodiment

Figure 6:
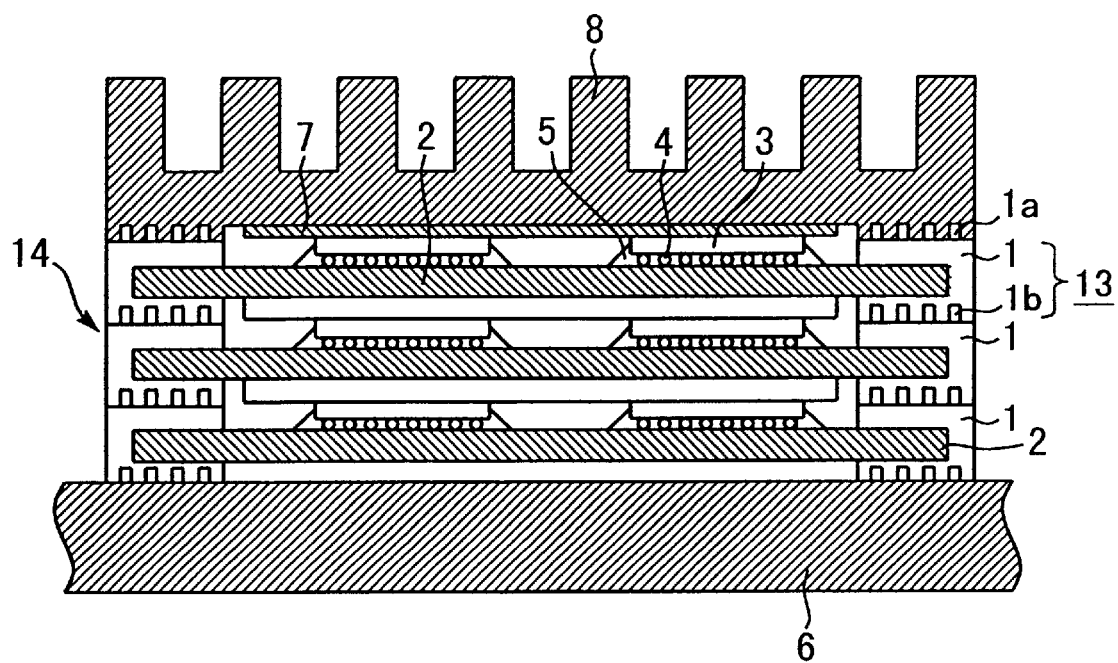
FIG. 6 is a structural cross-sectional view showing a semiconductor device of a sixth embodiment in which stacked block modules are included.

A sixth embodiment of the present invention will be described in detail by reference to corresponding drawings. Those elements which are the same as those described in connection with the previous embodiments are assigned the same reference numerals, and repetition of their explanations is omitted for brevity. FIG. 6 is a structural cross-sectional view showing a semiconductor device of the present embodiment to which the block socket 1 is three-dimensionally attached. In FIG. 6, reference numeral 14 designates a stacked block module comprising stacked three layers of the semiconductor block modules 13.

As shown in FIG. 6, in the semiconductor device of the present embodiment, the semiconductor chips 3 are mounted on each of the module boards 2, and the module boards 2 are fitted into the block socket 1. The protruding upper connection terminals 1a and the indented lower connection terminals 1b are provided on the block socket 1. The semiconductor block module 13 are stacked into layers in the vertical direction in the drawing sheet, thus constituting the stacked block module 14. Components to be mounted on the module board 2 are not limited to electronic components having the shape of a chip, such as chip capacitors. In a case where chip capacitors are mounted on the semiconductor substrates 2, high electrical stability of the semiconductor device can be achieved.

As a result, there can be readily embodied the stacked block module 14 in which the semiconductor block modules 13 are mounted three-dimensionally or stereoscopically. As a result, the module boards 2 of different types can be mounted on the system board 6 without involvement of an increase in mounting area.

In an example of the stacked block module, an electrical connection therein may be understood with reference to FIG. 1B. When the structure shown in FIG. 1B is stacked, the pins 1aa of the lower block socket 1 are mechanically secured into the holes 1bb of the upper block socket 1, and electrically connected to the connecting terminals 2a of a module board 2 housed in the uppers block socket 1.

Seventh Embodiment

Figure 7:
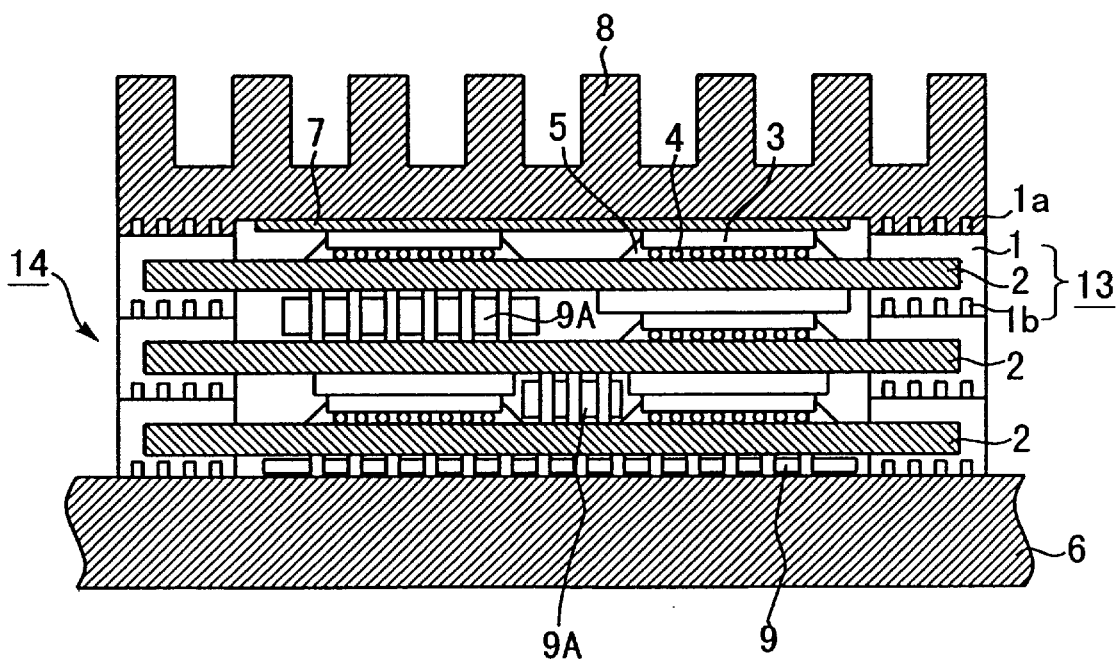
FIG. 7 is a structural cross-sectional view showing a semiconductor device of a seventh embodiment in which anisotropic conductive sheets are disposed between the stacked module boards.

A seventh embodiment of the present invention will now be described in detail by reference to corresponding drawings. Those elements which are the same as those described in connection with the previous embodiments are assigned the same reference numerals, and repetition of their explanations is omitted for brevity. FIG. 7 is a structural cross-sectional view showing a semiconductor device of the present embodiment in which the block sockets 1 are three-dimensionally attached and in which the anisotropic conductive sheets 9A are disposed between the stacked module boards 2.

As shown in FIG. 7, the semiconductor device of the present embodiment comprises the anisotropic conductive sheet 9A sandwiched between the adjacent module boards 2 at predetermined positions. This structure makes it possible for the semiconductor device to cope with a further increase in the number of pins, thereby minimizing the length of an electrical connection and achieving a high-speed characteristic. Namely, the anisotropic conductive sheet 9A can establish connecting circuits between the electric terminals of the upper and lower module boards 2.

Eighth Embodiment

Figure 8:
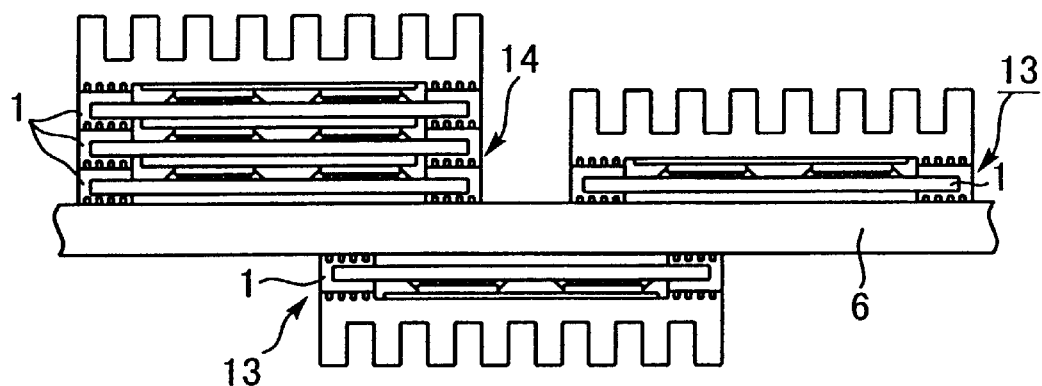
FIG. 8 is a structural cross-sectional view showing a semiconductor device of a eighth embodiment in which a plurality of block sockets are mounted at the predetermined positions on the system board.

An eighth embodiment of the present invention will be described in detail by reference to corresponding drawings. Those elements which are the same as those described in connection with the previous embodiments are assigned the same reference numerals, and repetition of their explanations is omitted for brevity. FIG. 8 is a structural cross-sectional view showing a semiconductor device of the present embodiment in which each predetermined number of the block socket 1 is or are mounted at the predetermined position on the system board 6. In FIG. 8, reference numeral 13 designates a semiconductor block module, and reference numeral 14 designates a stacked block module comprising multilayered semiconductor block modules 13.

As shown in FIG. 8, in the semiconductor device of the present embodiment, the block sockets 1 are stacked, in the vertical direction in the drawing sheet, into an arbitrary number of layers on either the front side (upper surface) or the back side (lower surface) of the system board 6 (three layers of the block sockets 1 and a single layer of the block socket 1 are shown in FIG. 8). Thus, the degree of freedom in design of a semiconductor device can be increased.

In the semiconductor device of the present embodiment, the semiconductor block module 13 consisting of the block sockets 1 and the inserted module board 2 may be mounted on either side, i.e., on both the front side (or upper surface) and the back side (or lower surface), of the system board 6. The multilayered block module 14 or a single layered semiconductor block module 13 is formed to enable removable insertion of the module board 1, thereby achieving a high degree of packaging reliability.

Ninth Embodiment

Figure 9:
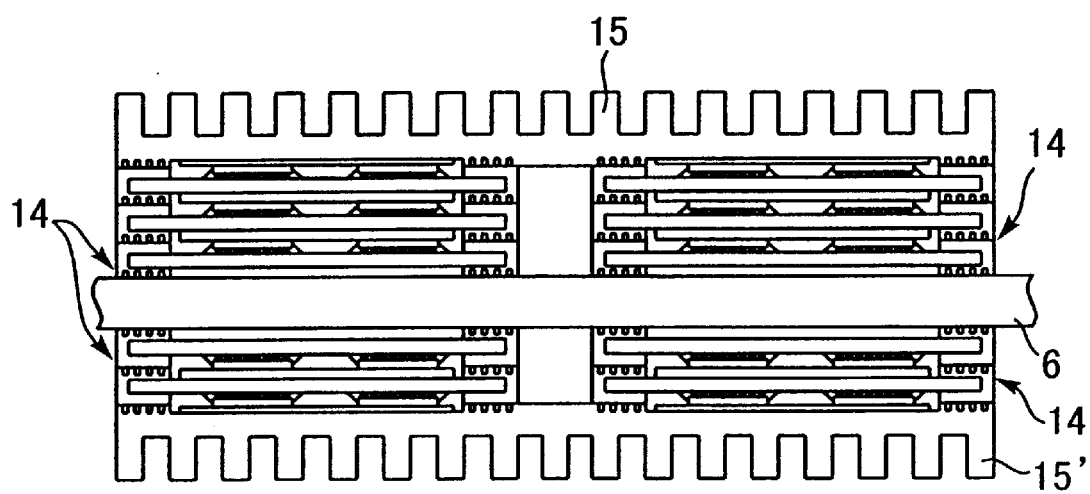
FIG. 9 is a structural cross-sectional view showing a semiconductor device of a ninth embodiment in which a common heat radiating plate is disposed on top of the block modules.

A ninth embodiment of the present invention will be described in detail by reference to corresponding drawings. Those elements which are the same as those described in connection with the previous embodiments are assigned the same reference numerals, and repetition of their explanations is omitted for brevity. FIG. 9 is a structural cross-sectional view showing a semiconductor device of the present embodiment in which the stacked block modules 14 are mounted on the system board 6 and in which a common heat radiating fin 15 or 15' is disposed on top of the stacked block modules 14. In FIG. 9, reference numerals 15 and 15' designate common radiating plates.

As shown in FIG. 9, in the semiconductor device of the present embodiment, the stacked block modules 14 mounted on one side of the system board 6 comprise the same number of layers of the semiconductor block modules 13. Similarly, the stacked block modules 14 mounted on the other side of the system board 6 comprise the same number of layers of the semiconductor block modules 13. In the present embodiment, as shown in FIG. 9, each of the stacked block modules 14 provided on the top side (upper surface) of the system board 6 comprises three layers of the semiconductor block modules 13, and each of the stacked block modules 14 provided on the back side (lower surface) of the system board 6 comprises two layers of the semiconductor block modules 13. The common dissipating plate 15 is provided so as to bridge cross the top of the three-layer block modules 14. Further, the common dissipating plate 15' is provided so as to bridge cross the top of the two-layer block modules 14. As a result, there can be achieved a much better heat dissipation characteristic. So long as the pins used for connecting the block sockets 1 to the system board 6 are standardized, manufacturing cost can be curtailed.

Tenth Embodiment

Figure 10A:
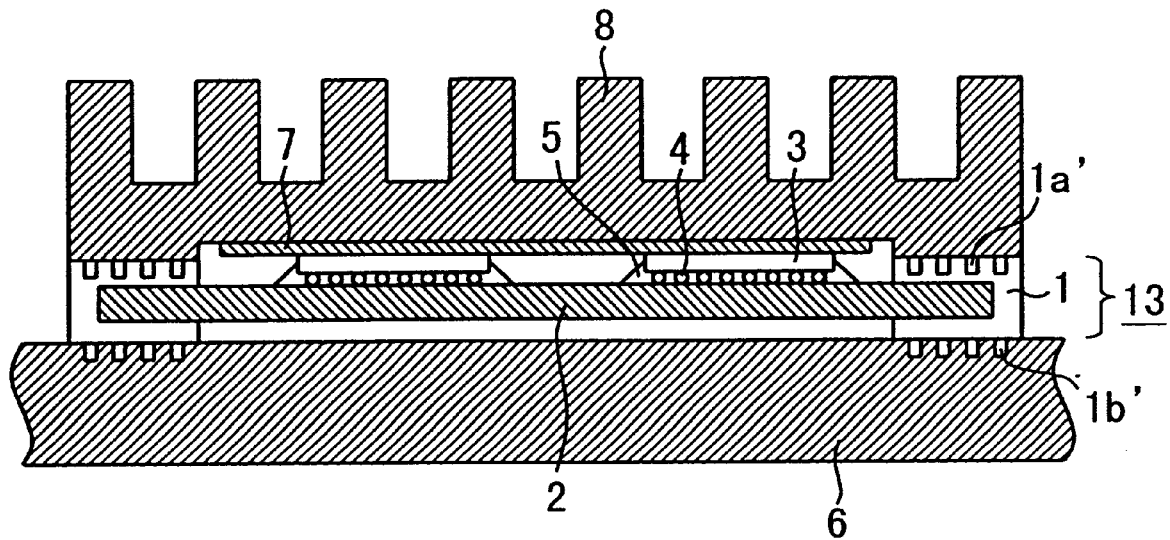
FIG. 10A is a cross-sectional view and FIG. 10B is a perspective view for describing a structure of the block socket and a semiconductor device according to a tenth embodiment.
Figure 10B:
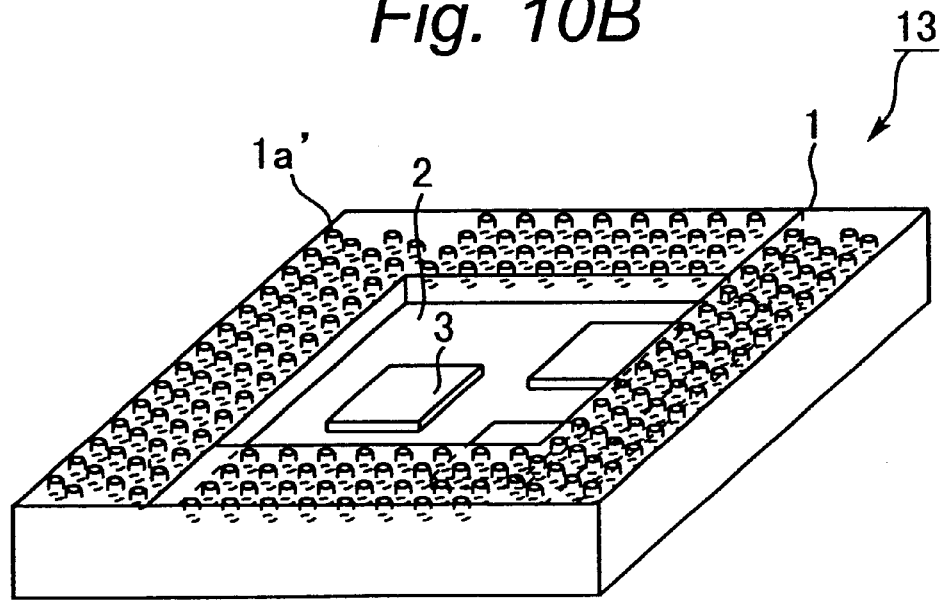

A tenth embodiment of the present invention will now be described in detail by reference to corresponding drawings. Those elements which are the same as those described in connection with the previous embodiments are assigned the same reference numerals, and repetition of their explanations is omitted for brevity. FIG. 10A is a cross-sectional view and FIG. 10B is a perspective view for describing the structure of the block socket 1 and its connection terminals of the semiconductor device according to the present embodiment. In FIG. 10A, reference numeral 1a' designates an indented upper connection terminal of the block socket 1, and 1b' designates a protruding lower connection terminal of the block socket 1.

In the semiconductor device of the present embodiment, as shown in FIGS. 10A and 10B, the indented connection terminals 1a' are employed as upper connection terminals for the block socket 1, in lieu of the protruding upper connection terminals 1a employed in the previous embodiments. Further, the protruding connection terminals ib' are employed as lower connection terminals for the block socket 1, in lieu of the indented lower connection terminals 1b. Even such a configuration enables embodiment of the same advantageous results and working effect as those yielded in the previous embodiments.

Eleventh Embodiment

Figure 11:
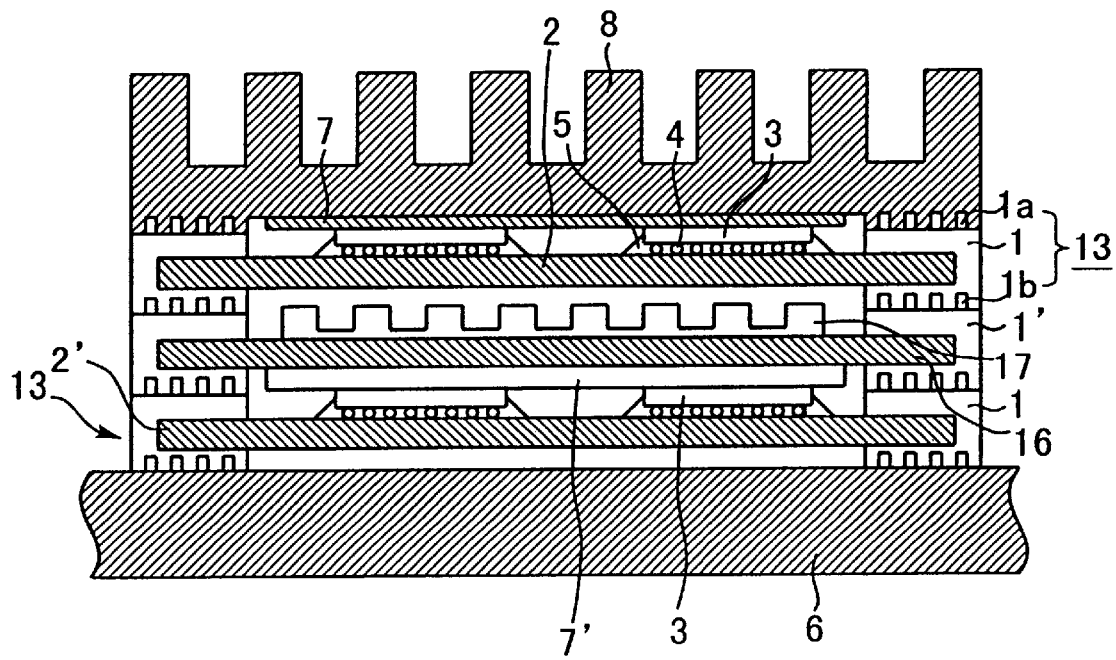
FIG. 11 is a structural cross-sectional view showing a semiconductor device of a eleventh embodiment equipped with a heat radiating module.

An eleventh embodiment of the present invention will now be described in detail by reference to corresponding drawings. Those elements which are the same as those described in connection with the previous embodiments are assigned the same reference numerals, and repetition of their explanations is omitted for brevity. FIG. 11 is a structural cross-sectional view showing a semiconductor device of the present embodiment equipped with a heat radiating module. In FIG. 11, reference numeral 1' designates a block socket; 16 designates a heat radiating board in substantially the same form as the module board 2 and fitted into the internal space of the block socket 1'; 17 designates a heat radiating block mounted on the heat radiating board 16; 7' designates a heat radiating sheet disposed under the heat radiating board 16; and 2' designates a module board positioned at underside of the heat radiating board 16. The heat radiating module comprises the block socket 1', the heat radiating board 16 and the heat radiating block 17.

As shown in FIG. 11, the heat radiating module comprises the block socket 1', the heat radiating board 16 fitted into the block socket 1' and the heat radiating block 17 mounted on the radiating board 16. The heat radiating module is located, via the heat radiating sheet 7', immediately above the semiconductor chip 3 on the module board 2' requiring dissipation of a particularly large amount of heat. This structure enables efficient dissipation of heat from a lower semiconductor chip 3 or a lower semiconductor block module 13.

The present embodiment as described above may be re-stated as follows. A semiconductor device comprises a heat radiating block module 13' stacked on a semiconductor block module 13. The heat radiating block module 13' includes a block socket 1' and a heat radiating board 16. The block socket assumes an annular shape, and has a plurality of connection terminals on upper and lower peripheral surfaces thereof, and has an inner groove 1c formed on the inner surface thereof. The heat radiating board 16 has a radiating block 17 mounted thereon, and fitted into the inner groove 1c of the another block socket 1'. The heat radiating block module 13' is mounted on the semiconductor block module 13, and the connection terminals 1a on the upper peripheral surface of the block socket 1 of the semiconductor block module 13 is mechanically fitted into the lower peripheral surface of the block socket 1' of the heat radiating block module 13'.

Twelfth Embodiment

Figure 12:
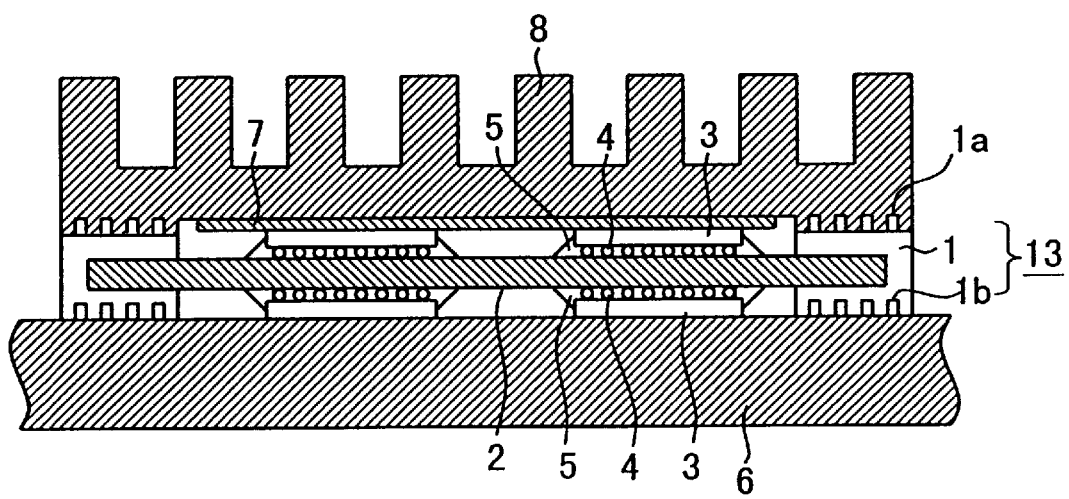
FIG. 12 is a structural cross-sectional view showing a semiconductor device of a twelfth embodiment, in which semiconductor chips are mounted on either side of a module board.

A twelfth embodiment of the present invention will now be described in detail by reference to corresponding drawings. Those elements which are the same as those described in connection with the previous embodiments are assigned the same reference numerals, and repetition of their explanations is omitted for brevity. FIG. 12 is a structural cross-sectional view showing a semiconductor device of the present embodiment, in which the semiconductor chips 3 are mounted on either side of the module board 2.

As shown in FIG. 12, in the semiconductor device of the present embodiment, the semiconductor chips 3 are mounted on either side of the module board 2, i.e., on both the top side (upper surface) and the back side (lower surface) of the module board 2. Components to be mounted on the module board 2 are not limited to the semiconductor chips 3, and any electronic components having the form of a chip, such as chip capacitors, may also be mounted on the module board 2. In a case where chip capacitors are mounted on the module board 2, high electrical stability of the semiconductor device can be achieved. Further, semiconductor chips may be mounted on the module board 2 by way of wires in lieu of bumps.

As mentioned previously, the present embodiment renders the system board 6 compact and enables high-speed performance and a further reduction in the length of an electrical connection.

Thirteenth Embodiment

Figure 13A:
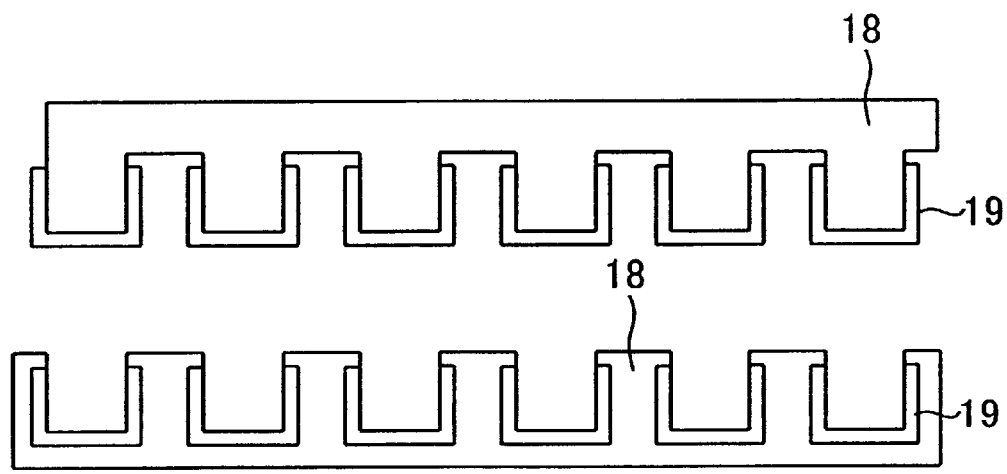
FIGS. 13A and 13B are structural cross-sectional views showing a geometry of connection terminals of a semiconductor block module in a thirteenth embodiment.
Figure 13B:
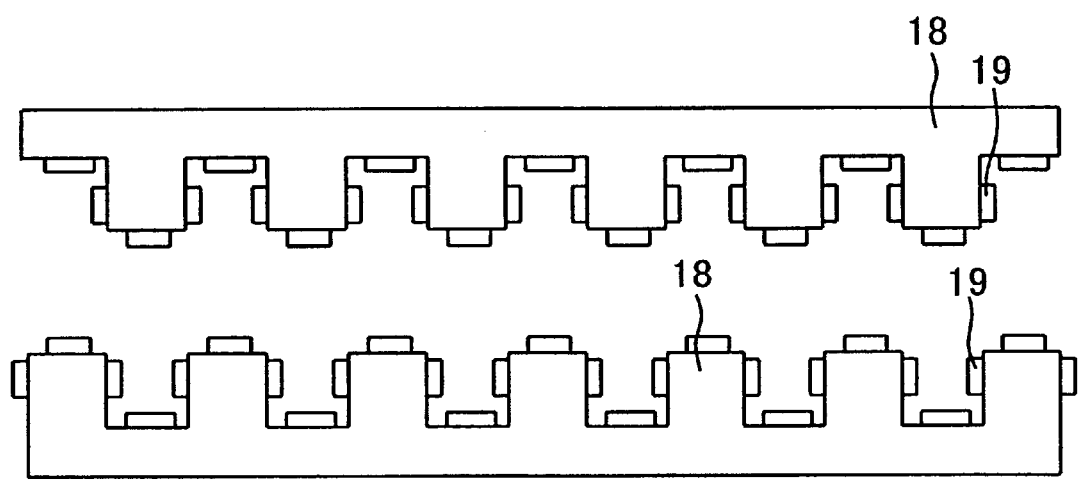
Figure 14:
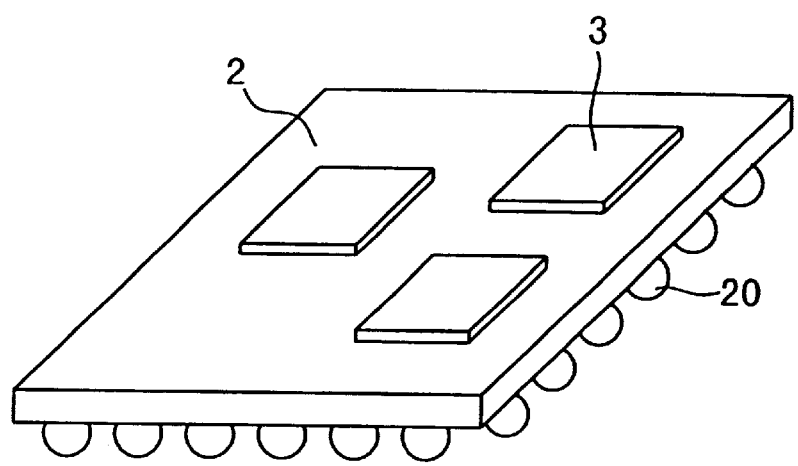
FIG. 14 is a perspective view showing a conventional semiconductor device in which a plurality of semiconductor chips is mounted on a module board.
Figure 15:
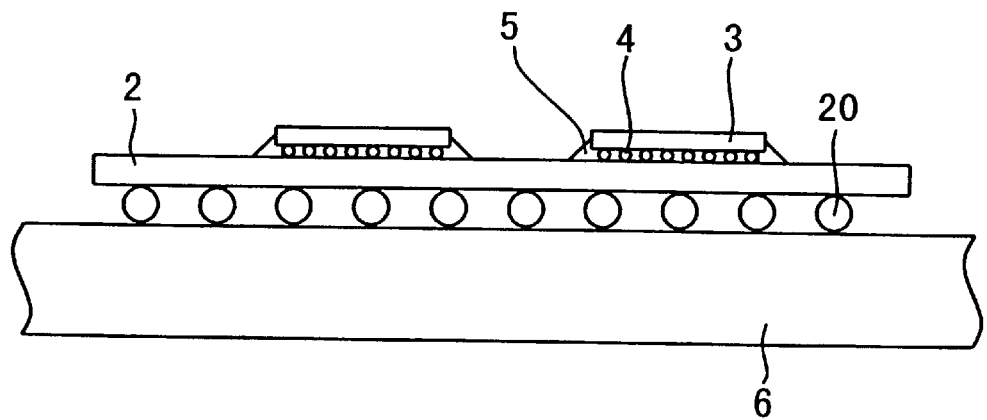
FIG. 15 is a structural cross-sectional view of a conventional semiconductor device in which a module board is mounted on a system board.

A thirteenth embodiment of the present invention will now be described in detail by reference to corresponding drawings. Those elements which are the same as those described in connection with the previous embodiments are assigned the same reference numerals, and repetition of their explanations is omitted for brevity. FIGS. 13A and 13B are structural cross-sectional views showing the geometry of connection terminals of the semiconductor device of the present embodiment, and more particularly showing examples of the detailed structure of the protruding or indented connection terminals 1a, 1a', 1b, 1b' of the block socket 1, 1". In FIGS. 13A and 13B, reference numeral 18 designates a connector housed in the block socket 1, and 19 designates a contact terminal.

In the semiconductor device of the present embodiment, as shown in FIG. 13A, a comb-shaped connector 18 provided in the upper block socket 1 is paired up with a counterpart comb-shaped connector 18 provided in the lower block socket 1 such that protuberances of one connector 18 mesh with recesses of another connector 18 in one-to-one correspondence. In one comb-shaped connector 18, a pin-type contact terminal 19 is provided on each protuberance. In the other comp-shaped connector 18, the pin-type contact terminal 19 is provided in each of recesses.

As shown in FIG. 13B, the contact terminal 19 provided in the connector 18 may assume a cubic shape. In this case, a plurality of pin-type contact terminals 19 are provided on each side of the protuberance, for instance, five sides of the protuberance as shown in the drawing. As a result, there can be embodied a connector 18 which requires a smaller mounting area and has a remarkably-increased number of pins.

The present embodiment as described above may be re-stated as follows. In the semiconductor block module 13, the connection terminals 1a, 1b, 1a', 1b' of the module socket 1 includes a plurality of protruding terminals and indented terminals respectively on opposite surfaces of the module socket 1. Further, the each of the protruding terminals and indented terminals has one or more contact terminals 19 on at least one surface thereof.

The present invention is not limited to the previous embodiments, and it is readily apparent that the embodiments of the present invention are susceptible to modifications within the technical scope of the invention, as required. The number, positions, and shapes of the constituent elements are not limited to those described in the previous embodiments, and may be changed to those desirable for carrying out the present invention.

The present invention as exemplified in the above embodiments yields the following advantageous results.

A first advantage is that since the module board 2 is mounted on the system board 6 by way of the block socket 1, there is prevented a connection failure, which would otherwise be caused by thermal expansion, thereby achieving greater packaging reliability than that achieved by the conventional semiconductor device.

A second advantage is that the module board 2 can be readily mounted on the system board 6 by means of simply inserting the module board 2 into the block socket 1, thus achieving greater packaging than that achieved by the conventional semiconductor device.

A third advantage is that such a high degree of ease of packaging enables facilitation of reworking of the semiconductor device.

A fourth advantage is that even when a semiconductor device is provided with, for example, 1000 pins or more, as a result of improvement in the performance of the system board 6 and an accompanying increase in the outer dimensions of the system board 6, the semiconductor device can sufficiently cope with such an increase in the number of pins.

A fifth advantage is that the radiating plate 8 can be readily mounted on the semiconductor device by way of the block socket 1. Accordingly, the radiating plate 8 can be connected directly to the semiconductor chips 3, thereby ensuring a sufficiently large heat dissipation area. Thus, the semiconductor device can exhibit a highly efficient heat dissipation.

A sixth advantage is that, since the semiconductor chips 3 can be stacked three-dimensionally, mounting area and manufacturing cost can be reduced.

A seventh advantage is that, by means of three-dimensional packaging of semiconductor chips as in the case of the sixth advantage, the length of connection between the semiconductor chips can be reduced, thus enabling the semiconductor device to exhibit high-speed electrical operation.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-371452, filed on Dec. 27, 1999 including specification, claims, drawings and summary, on which the Convention priority of the present application is based, are incorporated herein by reference in its entirety.

What is claimed is:

1. A semiconductor block module comprising:
    a block socket of an annular shape having connection terminals on upper and lower peripheral surfaces thereof and having an inner groove formed on the inner surface thereof; and a module board having a semiconductor chip mounted thereon and fitted into the inner groove of the block socket; wherein the module boar is electrically connected to the block socket, and the connection terminals on the upper peripheral surface of the block socket may be mechanically fitted into and electrically connected to the connection terminals on the lower peripheral surface of another block socket.

2. The semiconductor block module according to claim 1, wherein the module board having electronic components including a semiconductor element mounted on both surfaces thereof.

3. The semiconductor block module according to claim 1, wherein the block socket is formed to be disassembled and the module board is to be detached.

4. The semiconductor block module according to claim 3, wherein the block socket is assembled by a U-shaped block socket piece and a bar-shaped block socket piece.

5. The semiconductor block module according to claim 3, wherein the block socket is assembled by two L-shaped block socket pieces.

6. The semiconductor block module according to claim 1, wherein the connection terminals of the module socket includes a plurality of protruding terminals and indented terminals respectively on opposite surfaces of the module socket, and the each of the protruding terminals and indented terminals have one or more contact terminal on at least one surface thereof.

* * * * *